(12) United States Patent
Nielsen

(10) Patent No.: US 7,777,574 B1
(45) Date of Patent: Aug. 17, 2010

(54) CLOSED LOOP RAMP UP FOR POP AND CLICK REDUCTION IN AN AMPLIFIER

(75) Inventor: Allan Nogueras Nielsen, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 29 days.

(21) Appl. No.: 12/358,640

(22) Filed: Jan. 23, 2009

(51) Int. Cl.
*H03F 3/04* (2006.01)

(52) U.S. Cl. .......................... 330/296; 330/255; 330/51

(58) Field of Classification Search .................. 330/51, 330/255, 267, 296–297, 310–311
See application file for complete search history.

(56) References Cited

U.S. PATENT DOCUMENTS

| 5,436,588 A | 7/1995 | Ghaffaripour |
| 5,491,437 A | 2/1996 | Rincon et al. |
| 5,798,673 A | 8/1998 | Grifith et al. |
| 5,963,093 A | 10/1999 | Corsi |
| 6,292,057 B1 | 9/2001 | Corsi et al. |
| 6,798,285 B2 | 9/2004 | Candy |
| 7,030,699 B2 | 4/2006 | Richard et al. |
| 7,088,182 B2 | 8/2006 | Ivanov |
| 7,227,413 B1 | 6/2007 | Marty |
| 7,382,187 B2 | 6/2008 | Aisu |
| 7,557,658 B2 * | 7/2009 | Perez .......................... 330/255 |
| 2003/0067350 A1 | 4/2003 | Goutti et al. |

FOREIGN PATENT DOCUMENTS

EP 0 862 265 9/1998

* cited by examiner

*Primary Examiner*—Robert Pascal
*Assistant Examiner*—Hieu P Nguyen
(74) *Attorney, Agent, or Firm*—John J. Patti; Wade J. Brady, III; Frederick J. Telecky, Jr.

(57) ABSTRACT

To reduce pop or click during turn-on, a method and apparatus are provided. Initially, a plurality of current sources in the amplifier is actuated. The amplifier is transitioned from an off-state to an on-state in a class B amplifier mode by decoupling each input node of an output stage of the amplifier from a voltage rail, and the amplifier is transitioned from the on-state in the class B amplifier mode to an on-state in a class AB amplifier mode by actuating at least a portion of an intermediate circuit in the amplifier.

16 Claims, 4 Drawing Sheets

CLOSED LOOP RAMP UP FOR POP AND CLICK REDUCTION IN AN AMPLIFIER

TECHNICAL FIELD

The invention relates generally to an amplifier and, more particularly, to anti-pop or anti-click circuit for a AB amplifier.

BACKGROUND

Amplifiers are employed in many applications. In particular, operational amplifiers are often utilized to amplify voltages. As can be seen in FIG. 1, a conventional operational amplifier 104 in an inverting configuration is shown. In other words, the input voltage $V_{IN}$ is inverted, amplified, and supplied to load 106. These amplifiers often use a push-pull or other folded cascode arrangements, which have contrasting non-uniform output currents associated with the high and low sides of the amplifier. The differing output currents can be seed in FIG. 2. This difference in the output currents results in a pop or click caused by the differences in the output currents, which can be seen in FIG. 3. Over the years, however, several designs have been developed to combat pop or click. Some examples of these circuits are U.S. Patent Pre-Grant Pub. No. 2003/0067350; European Patent No. 0862265; and U.S. Pat. Nos. 5,436,588; 5,491,437; 5,798,673; 5,963,093; 6,292,057; 6,798,285; 7,030,699; 7,227,413; 7,088,182; and 7,382,187.

SUMMARY

An embodiment of the invention, accordingly, provides an amplifier. The amplifier comprises a plurality of voltage rails; a plurality of current sources, wherein each current source is actuated by a first signal; an input stage that is adapted to receive a plurality of input voltages, wherein the input stage includes at least one of the plurality of current sources; an intermediate circuit having at least one of the plurality of current sources, wherein at least a portion of the intermediate circuit is actuated by a second signal; an output stage that is coupled to the intermediate circuit at a plurality of input nodes; and a clamp that is coupled to the input nodes, wherein the clamp is actuated by a third signal, and wherein the clamp couples each of the input nodes to at least one of the plurality of voltage rails when actuated, and wherein the first signal actuates the plurality of current sources prior to the third signal de-actuating the clamp when the amplifier is activated, and wherein the third signal de-actuates the clamp prior to the second signal actuating at least a portion of the intermediate circuit when the amplifier is activated.

In accordance with an embodiment of the invention, the amplifier is a folded cascode amplifier.

In accordance with an embodiment of the invention, the intermediate circuit further comprises a plurality of branches, wherein each branch includes a first transistor that is adapted to be actuated by the second signal; a plurality of diode-connected transistors coupled in series with the first transistor; and at least one of the plurality of current sources coupled in series between the first transistor and the diode-connected transistors.

In accordance with an embodiment of the invention, the output stage further comprises an PMOS FET coupled to a first voltage rail of the plurality of voltage rails at its source, wherein the gate of the PMOS FET is coupled to at least one of the input nodes; and an NMOS FET coupled to a second voltage rail of the plurality of voltage rails at its source, wherein the gate of the NMOS FET is coupled to at least one of the input nodes, and wherein the drain of the NMOST FET is coupled to the drain of the PMOS FET at an output node.

In accordance with an embodiment of the invention, the clamp couples the gate of the PMOS FET to the first voltage rail when actuated.

In accordance with an embodiment of the invention, the clamp couples the gate of the NMOS FET to the second voltage rail when actuated.

In accordance with an embodiment of the invention, the input stage further comprises a first PMOS FET that is adapted to receive at least one of the input voltages at its gate; a second PMOS FET that is adapted to receive at least one of the input voltages at its gate; and at least one current source of the plurality of voltage source coupled between a first voltage rail of the plurality of voltage rails and the sources of the first and second PMOS FETs.

In accordance with an embodiment of the invention, the clamp further comprises a plurality of FETs, wherein each FET is coupled between at least one of the voltage rails and at least one of the input nodes, and wherein each FET is gated by the third signal.

In accordance with an embodiment of the invention, an apparatus is provided. The apparatus comprises a plurality of voltage rails; a folded cascode amplifier coupled to the voltage rails, wherein the amplifier includes a plurality of current sources, an input stage, and an output stage, wherein the plurality of current sources is adapted to be actuated by a first signal; an intermediate circuit coupled to the output stage, wherein the intermediate circuit includes at least one of the plurality of current sources, wherein at least a portion of the intermediate circuit is actuated by a second signal; and a clamp that is coupled to the output stage, wherein the clamp is actuated by a third signal, and wherein the clamp couples at least a portion of the output stage to at least one of the voltage rails when actuated, and wherein the first signal actuates the plurality of current sources prior to the third signal de-actuating the clamp when the amplifier is activated, and wherein the third signal de-actuates the clamp prior to the second signal actuating at least a portion of the intermediate circuit when the amplifier is activated.

In accordance with an embodiment of the invention, a method for activating an amplifier is provided. The method comprises actuating a plurality of current sources in the amplifier; transitioning the amplifier from an off-state to an on-state in a class B amplifier mode by de-coupling each input node of an output stage of the amplifier from a voltage rail; and transitioning the amplifier from the on-state in the class B amplifier mode to an on-state in a class AB amplifier mode by actuating at least a portion of an intermediate circuit in the amplifier.

In accordance with an embodiment of the invention, the step of transitioning the amplifier from an off-state to an on-state in a class B amplifier mode by de-coupling each input node of an output stage of the amplifier from a voltage rail further comprises the step of inputting a logic low voltage into at least one FET.

In accordance with an embodiment of the invention, the step of transitioning the amplifier from the on-state in the class B amplifier mode to an on-state in a class AB amplifier mode by actuating at least a portion of an intermediate circuit in the amplifier further comprising actuating a plurality of branches in the intermediate circuit.

The foregoing has outlined rather broadly the features and technical advantages of the invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the invention. It should also be realized by those skilled in the art that such equivalent constructions do not depart from the spirit and scope of the invention as set forth in the appended claims.

BRIEF DESCRIPTION OF THE DRAWINGS

For a more complete understanding of the invention, and the advantages thereof, reference is now made to the following descriptions taken in conjunction with the accompanying drawings, in which:

FIG. 2 is a graph depicting the output currents of the operational amplifier of FIG. 1 when the amplifier is turned on;

FIG. 3 is depicting an output voltage of the operation amplifier of FIG. 1 when the amplifier is turned on;

FIG. 6 is a graph depicting the output currents of the amplifier of FIG. 4 when the amplifier is turned on.

DETAILED DESCRIPTION

Figure 1:
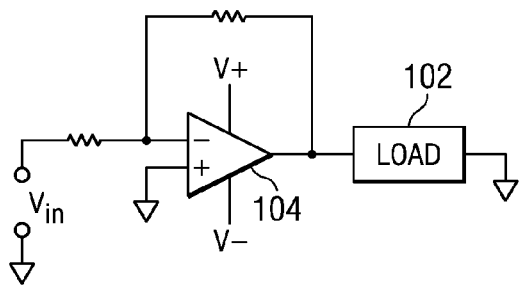
FIG. 1 is a conventional operational amplifier in an inverting configuration.

Refer now to the drawings wherein depicted elements are, for the sake of clarity, not necessarily shown to scale and wherein like or similar elements are designated by the same reference numeral through the several views.

Figure 4A:
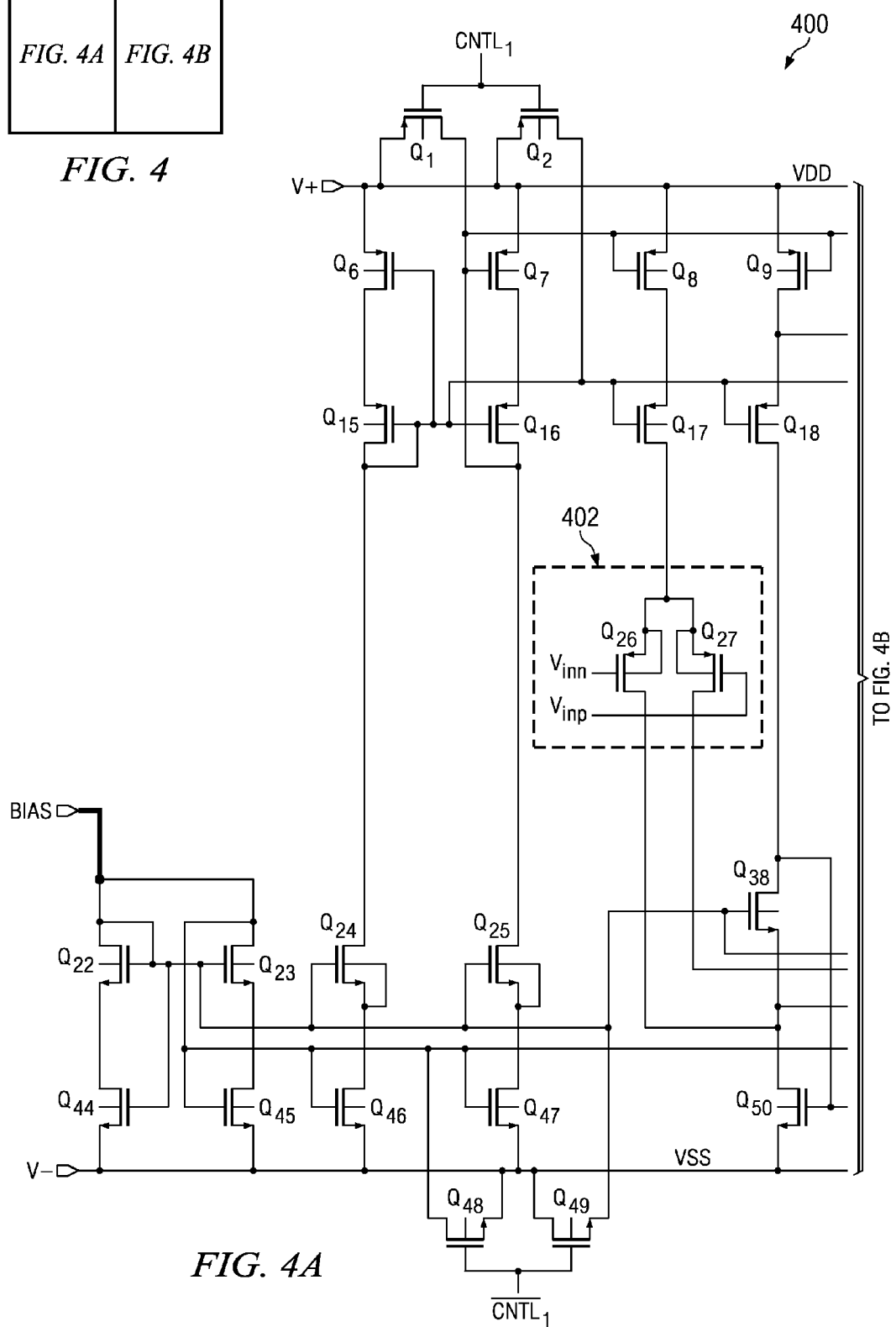
FIG. 4 is an amplifier in accordance with an embodiment of the invention.
Figure 4B:
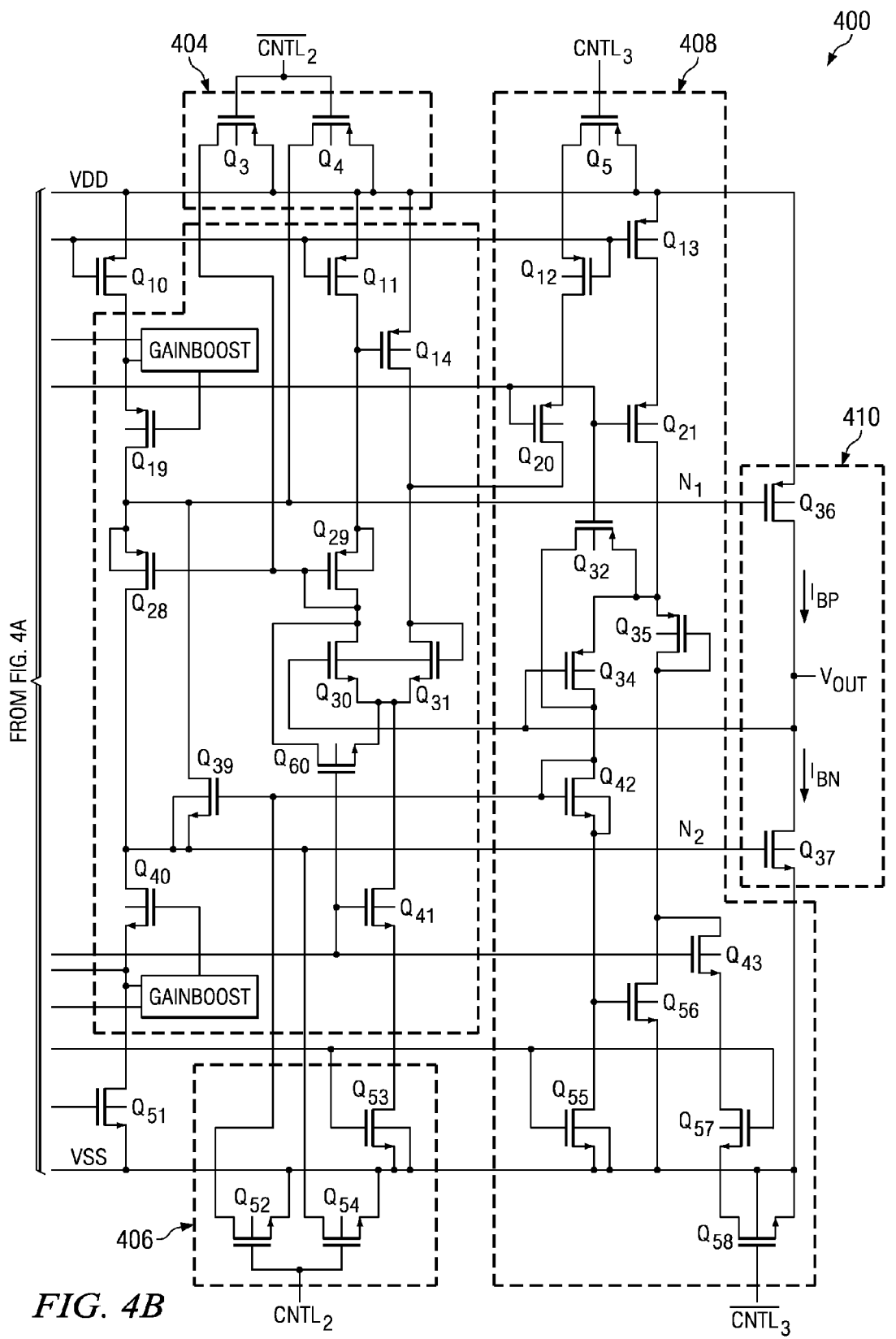
Figure 5:
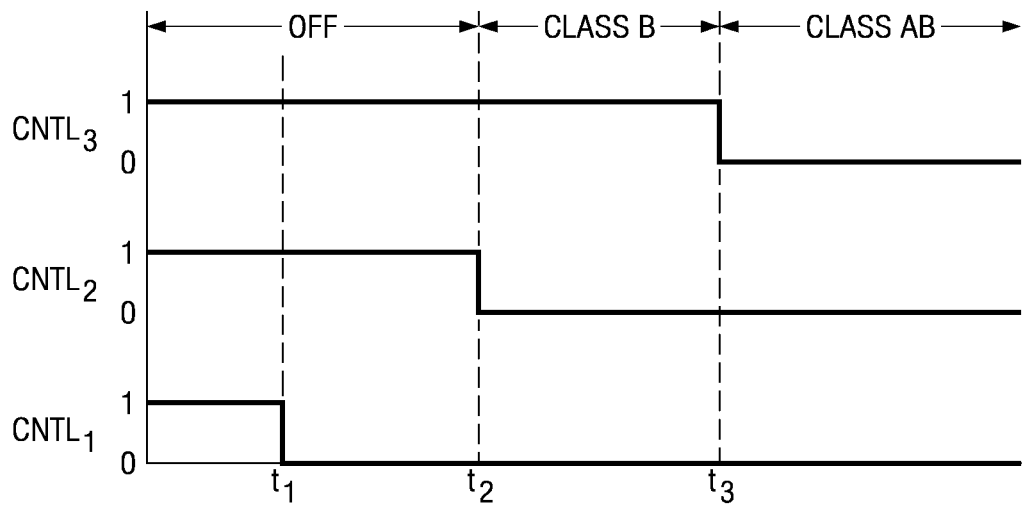
FIG. 5 is a timing diagram depicting the turn-on sequence of the amplifier of FIG. 4.
Figure 6:
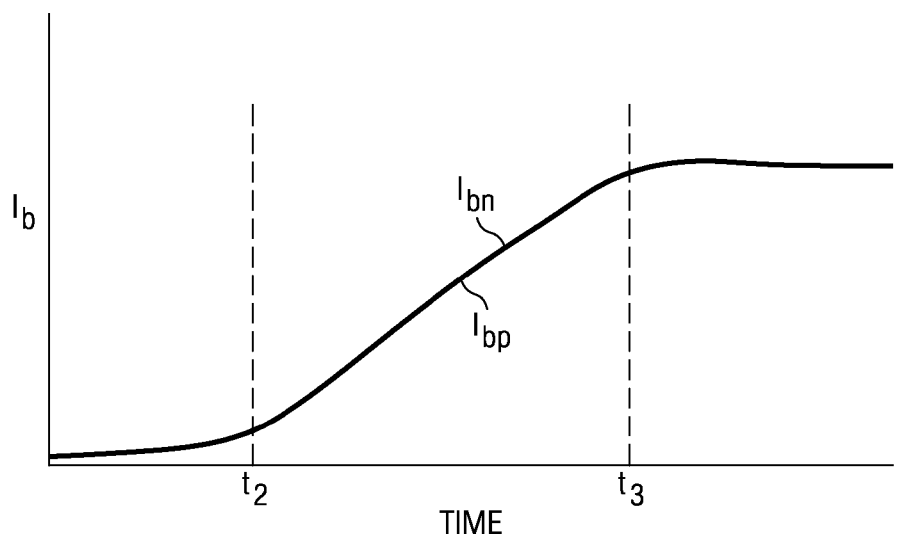

Referring to FIG. 4 of the drawings, the reference numeral 400 generally designates an amplifier in accordance with an embodiment of the invention. The amplifier 400 generally has a folded cascode-type input stage 402 and an output stage 410. The input stage 402 and the output stage 410 are coupled to a positive voltage rail $V_+$ and a negative voltage rail $V_-$, which supply power to the amplifier 400.

As part of the amplifier 400, a number of current sources are employed. The current sources are generally comprised of N-type transistors $Q_1$ through $Q_{18}$, $Q_{20}$, $Q_{21}$, and $Q_{32}$ (preferably PMOS FETs) and P-type transistors $Q_{22}$ through $Q_{25}$ $Q_{38}$, $Q_{40}$, $Q_{41}$, $Q_{43}$, $Q_{44}$ through $Q_{51}$, $Q_{53}$, $Q_{55}$, $Q_{57}$, and $Q_{60}$ (preferably NMOS FETs) that are arranged in various configurations, such as current mirrors. The current sources are coupled between the voltage rails V+ and V− and are actuated or "turned on" by control $CNTL_1$. Specifically, the control electrodes (or gates in a FET configuration) receive the control $CNTL_1$. Additionally, a bias BIAS can be received through transistors $Q_{22}$ and $Q_{23}$.

The input stage 402 is generally comprised of a pair of transistors $Q_{26}$ and $Q_{27}$, which is coupled to current sources (such as transistors $Q_{51}$ and $Q_{50}$). Preferably, transistors $Q_{26}$ and $Q_{27}$ are comprised of a PMOS FETs, respectively, coupled to one another at their source in a folded cascode arrangement. Each of the transistors $Q_{26}$ and $Q_{27}$ receive input voltages $V_{INP}$ and $V_{INN}$ at their control electrodes (gates in the FET arrangement) and generally correspond to the inverting and non-inverting inputs of an operational amplifier. Coupled between an electrode (sources in the FET arrangement) of the transistors $Q_{26}$ and $Q_{27}$ and the positive voltage rail $V_+$ through transistors $Q_{17}$ and $Q_{18}$ (which are each actuated by a signal $CNTL_1$).

The output stage 410 is generally comprised of a pair of transistors $Q_{36}$ and $Q_{37}$ coupled in series with one another between positive voltage rail $V_+$ and negative voltage rail $V_-$. Preferably, transistor $Q_{36}$ is a PMOS FET, while transistor $Q_{37}$ is an NMOS FET. Transistor $Q_{36}$ would correspond to the high side of the amplifier 400, outputting positive output current $I_{BP}$ to the output node $V_{OUT}$ (which is the node between transistors $Q_{36}$ and $Q_{37}$). Transistor $Q_{37}$ would correspond to the low side of the amplifier 400, outputting negative output current $I_{BN}$ to the output node $V_{OUT}$. Additionally, the control electrode (gate in the FET arrangement) of transistor $Q_{36}$ is coupled to the node $N_1$, while the control electrode (gate in the FET arrangement) of transistor $Q_{37}$ is coupled to node $N_2$.

In addition to the input stage 402 and the output stage 410, the amplifier 400 includes a clamp 404 and 406. The clamp 404 and 406 is generally comprised of two pair of transistors $Q_3/Q_4$ (which are preferably PMOS FETs, respectively) and $Q_{52}/Q_{54}$ (which are preferably NMOS FETs, respectively). Transistors $Q_4$ is coupled between node $N_1$ and positive voltage rail $V_+$, so that when transistor $Q_4$ is actuated, transistor $Q_4$ couples or rails the node $N_1$ to positive voltage rail $V_+$. Transistor $Q_{54}$ is coupled between node $N_2$ and negative voltage rail $V_-$, so that when transistor $Q_{54}$ is actuated, transistor $Q_{54}$ couples or rails the node $N_2$ to negative voltage rail $V_-$. Additionally, each transistor $Q_3$ and $Q52$ clamp other nodes within the circuit 400. Each of these transistors $Q_3$, $Q_4$, $Q_{52}$, and $Q_{54}$ are also actuated by a signal $CNTL_2$.

Amplifier 400 also includes an intermediate circuit 408, which comprises the majority of the circuit 400. Intermediate circuit 408 is generally comprised of gain boost elements and transistors $Q_{19}$, $Q_{28}$, $Q_{39}$, $Q_{40}$, $Q_{30}$, $Q_{14}$, $Q_{29}$, $Q_{40}$, $Q_{31}$, $Q_{42}$, $Q_{34}$, and $Q_{35}$. Preferably, the intermediate circuit 408 generally employs two activation branches, which are coupled to current sources. The first branch generally includes transistors $Q_{12}$ and $Q_{20}$ (which operate as current sourcing transistors and with transistor $Q_5$ operating as a switch control by $CNTL_3$) coupled to the positive voltage rail $V_+$ (through transistor $Q_5$) and a diode-connected transistor $Q_{31}$ coupled in series with one another. Preferably, diode-connected transistor $Q_{31}$ is coupled to the negative voltage rail $V_-$ through transistors $Q_{41}$ and $Q_{53}$ (which operate as current sourcing transistors). The second branch generally includes transistors $Q_{57}$ and $Q_{43}$ (which operate as current source transistors) coupled to the negative voltage rail $V_-$ (through transistor $Q_{58}$) and a diode-connected transistor $Q_{35}$ coupled in series with one another. Preferably, diode-connected transistor $Q_{35}$ is coupled to the positive voltage rail $V_+$ through transistors $Q_{13}$ and $Q_{21}$ (which operate as current source transistors). Each of the first and second branches is coupled to the nodes $N_1$ and $N_2$ (respectively) through transistors $Q_{29}/Q_{30}/Q_{28}$ and $Q_{34}/Q_{42}/Q_{39}$ (respectively). Additionally, each of transistors $Q_5$ and $Q_{58}$ are actuated by a signal $CNTL_3$.

Figure 2:
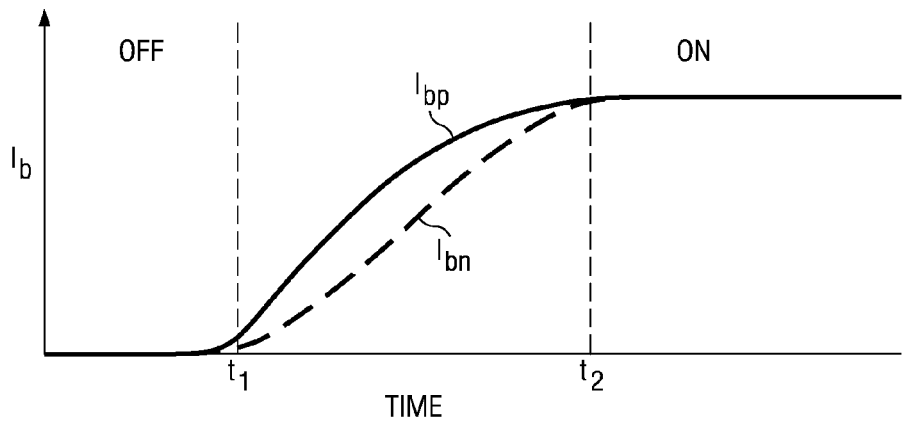
Figure 3:
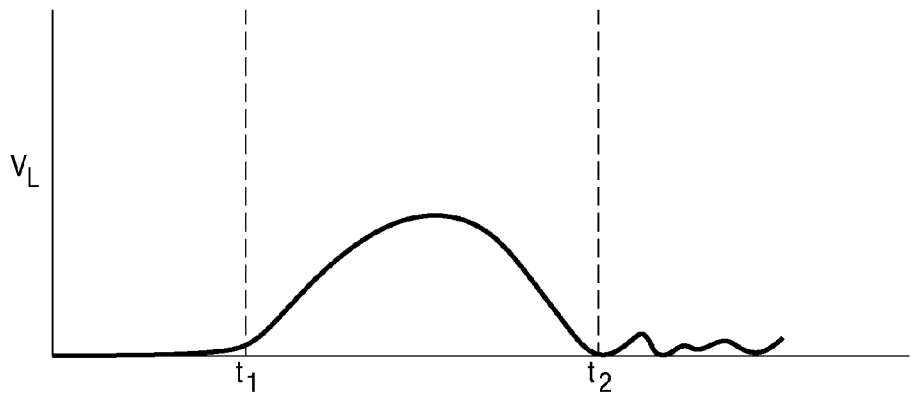

To reduce pop or click when the amplifier 400 is switched from an off-state to an on-state the output currents $I_{BP}$ and $I_{BN}$ are to closely follow one another as shown in FIG. 3. To accomplish this, transistors from the amplifier 400 are actuated in sequence as shown in FIG. 2. When the amplifier 400 is in an off-state (shown as time between $t_0$ and $t_1$), each of the signals $CNTL_1$, $CNTL_2$, and $CNTL_3$ are logic high or 1. At time $t_1$, signal $CNTL_1$ transitions from logic high to logic low or 0, which causes current sources to turn on or become actuated.

At the time between $t_1$ and $t_2$, the amplifier 400 remains in an off-state; however, at time $t_2$, the signal $CNTL_2$ transitions to logic low. When signal $CNTL_2$ transitions to logic low, transistors $Q_3$, $Q_4$, $Q_{52}$, and $Q_{54}$ are "shut-off" or de-actuated, which decouples the nodes $N_1$ and $N_2$ from the positive voltage rail $V_+$ and negative voltage rail $V_-$, respectively. At this point the amplifier 400 is operating in an on-state as a class B amplifier or in class B amplifier mode, so if input voltages $V_{INP}$ and $V_{INN}$ are input to control electrodes of transistor $Q_{26}$ and $Q_{27}$, an amplified voltage will be output through the output node $V_{OUT}$.

At time $t_3$, signal $CNTL_3$ transitions to logic low. When this transition occurs, a portion of the intermediate circuit 408 is actuated, namely the braches of the intermediate circuit 408 are actuated by virtue of the actuation of transistors $Q_5$ and $Q_{58}$. After $t_3$, amplifier 400 operates in an on-state as a class AB amplifier or in a class AB amplifier mode, and due to the staging or intermediate operation as a class B amplifier, output currents $I_{PB}$ and $I_{BN}$ closely match one another, effectively eliminating a pop or click during turn-on of the amplifier 400.

Having thus described the invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the invention may be employed without a corresponding use of the other features. Accordingly, it is appropriate that the appended claims be construed broadly and in a manner consistent with the scope of the invention.

The invention claimed is:

1. An amplifier comprising:
  a plurality of voltage rails;
  a plurality of current sources, wherein each current source is actuated by a first signal;
  an input stage that is adapted to receive a plurality of input voltages, wherein the input stage includes at least one of the plurality of current sources;
  an intermediate circuit having at least one of the plurality of current sources, wherein at least a portion of the intermediate circuit is actuated by a second signal;
  an output stage that is coupled to the intermediate circuit at a plurality of input nodes; and
  a clamp that is coupled to the input nodes, wherein the clamp is actuated by a third signal, and wherein the clamp couples each of the input nodes to at least one of the plurality of voltage rails when actuated, and wherein the first signal actuates the plurality of current sources prior to the third signal de-actuating the clamp when the amplifier is activated, and wherein the third signal de-actuates the clamp prior to the second signal actuating at least a portion of the intermediate circuit when the amplifier is activated.

2. The amplifier of claim 1, wherein the amplifier is a folded cascode amplifier.

3. The amplifier of claim 1, wherein the intermediate circuit further comprises a plurality of branches, wherein each branch includes:
  a first transistor that is adapted to be actuated by the second signal;
  a plurality of diode-connected transistors coupled in series with the first transistor; and
  at least one of the plurality of current sources coupled in series between the first transistor and the diode-connected transistors.

4. The amplifier of claim 1, wherein the output stage further comprises:
  an PMOS FET coupled to a first voltage rail of the plurality of voltage rails at its source, wherein the gate of the PMOS FET is coupled to at least one of the input nodes; and
  an NMOS FET coupled to a second voltage rail of the plurality of voltage rails at its source, wherein the gate of the NMOS FET is coupled to at least one of the input nodes, and wherein the drain of the NMOST FET is coupled to the drain of the PMOS FET at an output node.

5. The amplifier of claim 4, wherein the clamp couples the gate of the PMOS FET to the first voltage rail when actuated.

6. The amplifier of claim 4, wherein the clamp couples the gate of the NMOS FET to the second voltage rail when actuated.

7. The amplifier of claim 1, wherein the input stage further comprises:
  a first PMOS FET that is adapted to receive at least one of the input voltages at its gate;
  a second PMOS FET that is adapted to receive at least one of the input voltages at its gate; and
  at least one current source of the plurality of voltage sources coupled between a first voltage rail of the plurality of voltage rails and the sources of the first and second PMOS FETs.

8. The amplifier of claim 1, wherein the clamp further comprises a plurality of FETs, wherein each FET is coupled between at least one of the voltage rails and at least one of the input nodes, and wherein each FET is gated by the third signal.

9. An apparatus comprising:
  a plurality of voltage rails;
  a folded cascode amplifier coupled to the voltage rails, wherein the amplifier includes a plurality of current sources, an input stage, and an output stage, and wherein the plurality of current sources are adapted to be actuated by a first signal;
  an intermediate circuit coupled to the output stage, wherein the intermediate circuit includes at least one of the plurality of current sources, wherein at least a portion of the intermediate circuit is actuated by a second signal; and
  a clamp that is coupled to the output stage, wherein the clamp is actuated by a third signal, and wherein the clamp couples at least a portion of the output stage to at least one of the voltage rails when actuated, and wherein the first signal actuates the plurality of current sources prior to the third signal de-actuating the clamp when the amplifier is activated, and wherein the third signal de-actuates the clamp prior to the second signal actuating at least a portion of the intermediate circuit when the amplifier is activated.

10. The apparatus of claim 9, wherein the intermediate circuit further comprises a plurality of braches, wherein each branch includes:
  a first transistor that is adapted to be actuated by the second signal;
  a plurality of diode-connected transistors coupled in series with the first transistor; and
  at least one of the plurality of current sources coupled in series between the first transistor and the diode-connected transistors.

11. The apparatus of claim 9, wherein the output stage further comprises:
  an PMOS FET coupled to a first voltage rail of the plurality of voltage rails at its source, wherein the gate of the PMOS FET is coupled to at least one of the input nodes; and
  an NMOS FET coupled to a second voltage rail of the plurality of voltage rails at its source, wherein the gate of the NMOS FET is coupled to at least one of the input nodes, and wherein the drain of the NMOST FET is coupled to the drain of the PMOS FET at an output node.

12. The apparatus of claim 9, wherein the input stage further comprises:
- a first PMOS FET that is adapted to receive at least one of the input voltages at its gate;
- a second PMOS FET that is adapted to receive at least one of the input voltages at its gate; and
- at least one current source of the plurality of voltage sources coupled between a first voltage rail of the plurality of voltage rails and the sources of the first and second PMOS FETs.

13. The apparatus of claim 9, wherein the clamp further comprises a plurality of FETs, wherein each FET is coupled between at least one of the voltage rails and the output stage, and wherein each FET is gated by the third signal.

14. A method for activating an amplifier, the method comprising:
- actuating a plurality of current sources in the amplifier;
- transitioning the amplifier from an off-state to an on-state in a class B amplifier mode by de-coupling each input node of an output stage of the amplifier from a voltage rail; and
- transitioning the amplifier from the on-state in the class B amplifier mode to an on-state in a class AB amplifier mode by actuating at least a portion of an intermediate circuit in the amplifier.

15. The method of claim 14, wherein the step of transitioning the amplifier from an off-state to an on-state in a class B amplifier mode by de-coupling each input node of an output stage of the amplifier from a voltage rail further comprises the step of inputting a logic low voltage into at least one FET.

16. The method of claim 14, wherein the step of transitioning the amplifier from the on-state in the class B amplifier mode to an on-state in a class AB amplifier mode by actuating at least a portion of an intermediate circuit in the amplifier further comprises actuating a plurality of branches in the intermediate circuit.

* * * * *